United States Patent [19]

Watanabe et al.

[11] Patent Number: 5,726,720
[45] Date of Patent: Mar. 10, 1998

[54] LIQUID CRYSTAL DISPLAY APPARATUS IN WHICH AN INSULATING LAYER BETWEEN THE SOURCE AND SUBSTRATE IS THICKER THAN THE INSULATING LAYER BETWEEN THE DRAIN AND SUBSTRATE

[75] Inventors: Takanori Watanabe, Atsugi; Mamoru Miyawaki, Isehara, both of Japan

[73] Assignee: Canon Kabushiki Kaisha, Tokyo, Japan

[21] Appl. No.: 610,355

[22] Filed: Mar. 4, 1996

[30] Foreign Application Priority Data

Mar. 6, 1995 [JP] Japan .................. 7-070449

[51] Int. Cl.⁶ .................. G02F 1/136; G02F 1/1333
[52] U.S. Cl. .................. 349/43; 349/138
[58] Field of Search .................. 359/54, 59, 79; 349/42, 43, 138

[56] References Cited

U.S. PATENT DOCUMENTS

| | | | |
|---|---|---|---|
| 5,218,232 | 6/1993 | Yuzurihara et al. | 257/754 |
| 5,412,240 | 5/1995 | Inoue et al. | 257/347 |
| 5,434,433 | 7/1995 | Takasu et al. | 349/43 |
| 5,434,441 | 7/1995 | Inoue et al. | |
| 5,504,019 | 4/1996 | Miyasaka et al. | 437/40 |

FOREIGN PATENT DOCUMENTS

| | | | |
|---|---|---|---|
| 57-132191 | 8/1982 | Japan . | |
| 1-134426 | 5/1989 | Japan | 359/59 |
| 2-198428 | 8/1990 | Japan | 349/42 |
| WO89/02095 | 3/1989 | WIPO . | |

Primary Examiner—William L. Sikes
Assistant Examiner—Walter Malinowski
Attorney, Agent, or Firm—Fitzpatrick, Cella, Harper & Scinto

[57] ABSTRACT

A liquid crystal display apparatus is provided in which a semiconductor layer for constituting the matrix substrate or an electroconductive layer is placed under the transistor with interposition of an insulating layer, and the insulating layer has a larger thickness between the source and the semiconductor layer or the electroconductive layer than that between the drain and the semiconductor layer or the electroconductive layer.

10 Claims, 10 Drawing Sheets

LIQUID CRYSTAL DISPLAY APPARATUS IN WHICH AN INSULATING LAYER BETWEEN THE SOURCE AND SUBSTRATE IS THICKER THAN THE INSULATING LAYER BETWEEN THE DRAIN AND SUBSTRATE

BACKGROUND OF THE INVENTION

1. Field of the Invention

The present invention relates to a liquid crystal display apparatus, particularly to an active matrix type of liquid crystal display apparatus having a switching element for each picture element.

2. Related Background Art

FIG. 1 shows an equivalent circuit of a picture element cell of an active matrix type of liquid crystal display. In FIG. 1, the numeral 1001 denotes a signal wiring; 1002, a picture element transistor; and 1003, a gate line for controlling the on/off state of the transistor 1002. An image signal given to the signal wiring 1001 is written into the picture element electrode through the picture element transistor 1002, and is applied as a voltage to the liquid crystal 1004. However, the signal written once on the element electrode will change owing to a leakage current to the liquid crystal and the leakage to the picture element. Therefore, retain the potential of the picture element until the subsequent writing, a retention capacitance 1005 is provided parallel to the picture element electrode.

FIG. 2A illustrates a sectional view of a structure of a conventional picture element cell (Japanese Patent Publication No. 1-33833), and FIG. 2B illustrates a plan view of the structure thereof. FIGS. 2A and 2B, the numeral 1101 denotes a transparent insulating substrate; 1102, a signal wiring; 1103, a gate line formed from polysilicon; 1104, an insulating film formed by oxidation of the polysilicon 1103; 1105, a source for the picture element transistor; 1106, a drain of the picture element transistor; 1107, an electrode for forming the retention capacitance, which also forms a capacitance with the extended region of the drain 1106, namely the picture element electrode 1109, with interposition of the insulating film 1108.

Assuming the leakage current of the aforementioned picture element transistor to be $1 \times 10^{-14}$ A, the retention capacitance of 30 pF is required for controlling the potential variation to be within 10 mV for the retention time of $\frac{1}{30}$ second. In the example of the conventional picture element transistor in FIGS. 2A and 2B, assuming the insulating film 1108 to be an $SiO_2$ film of 600 Å thickness, an area of about 50 $\mu m^2$ is required for obtaining the capacitance of 30 pF. This is a great barrier in achieving fineness of the display apparatus. For example, in an electronic view finder of 0.5 inch having 100,000 picture elements, the area for one picture element is about 700 $\mu m^2$, and aperture loss caused by the capacitance formation is about 7%, whereas in designing 300,000 picture elements for a view finder of the same size, the area for one picture element is about 230 $\mu m^2$, and the aperture loss by the capacitance formation amounts to about 20% of that area. In the case of a reflection panel, an increase of the number of the picture elements results in a decrease of the area for each picture element causing a loss of the necessary capacitance disadvantageously.

Further, in the example shown in FIGS. 2A and 2B, the common electrode 1107, which is formed simultaneously with the gate line 1103, is wired in one direction so as not to cross over the Gate line 1103. Therefore the resistance of the wiring for the common electrode becomes higher, which causes variation of the potential of the common electrode on the writing of signals into the picture element electrode.

Furthermore, the insulating film, which is formed by oxidation of polysilicon, is not so reliable as an oxidation film of monocrystalline silicon, and is liable to cause leakage or dielectric breakdown in a region of decreased film thickness.

Under such circumstances, International (PCT) Patent Laid-Open Publication WO 89/02095 discloses a technique of effective formation of capacitance. FIG. 3 illustrates schematically the liquid display apparatus disclosed by the above WO 89/02095. The liquid crystal display apparatus shown in FIG. 3 comprises a silicon wafer 11, an insulating layer 13 formed thereon by ion implantation, a transistor formed further thereon having a source 21, a drain 17, a gate oxidation film 27, and a gate 29, a picture element electrode 33 connected to the source 21, and a constituting member 36 on the picture element electrode 33. In this apparatus, according to WO 89/02095, the source/capacitor region 21 serves as the one plate, and the substrate 11 serves as the other plate. The capacitance formed by the source/capacitor region 21 and the substrate 11 retains the voltage applied through the picture element electrode to the liquid crystal.

The inventors of the present invention studied the, liquid display apparatus disclosed in WO 89/02095, and found that the parasitic capacitance becomes larger between a signal wiring (not shown in the drawing) connected to the drain 17 and the substrate 11 owing to formation of a transistor on the uniform thin insulating layer 13 on the substrate 11. The larger parasitic capacitance results in a larger time constant, which can hinder normal driving of the liquid crystal in a display apparatus having a large number of picture elements.

SUMMARY OF THE INVENTION

An object of the present invention is to provide a liquid crystal display apparatus in which the above problems are solved.

Another object of the present invention is to provide a liquid crystal display apparatus in which the retention capacitance for holding the voltage to be applied to the liquid crystal is formed efficiently and the parasitic capacitance of the wiring signal is decreased.

The liquid crystal display apparatus of-the invention is comprised of elements each comprising a transistor at a region corresponding to a crossing region of a data signal wiring and a scanning signal wiring; a matrix substrate having data signal wiring connected to a source of the transistor, the scanning signal wiring connected to a gate of the transistor, and a picture element electrode connected to a drain of the transistor; an opposing substrate having a counter electrode opposing to the picture element electrode; and a liquid crystal layer interposed between the matrix substrate and the opposing electrode, wherein a semiconductor layer for forming the matrix substrate or an electroconductive layer is placed under the transistor with interposition of an insulating layer, and the insulating layer has a larger thickness between the source and the semiconductor layer or the electroconductive layer than that between the drain and the semiconductor layer or the electroconductive layer.

The above constitution of the liquid crystal display apparatus solves the aforementioned problems and achieves the above objects.

In the liquid crystal display apparatus of the present invention, a capacitance is formed between the drain and the semiconductor layer or the conducting layer by placing the semiconductor layer or the conducting layer under the drain with interposition of an insulating layer. Thereby, a liquid crystal display apparatus can be realized which has a larger retention capacitance with a smaller size of picture elements without significant decrease of the aperture ratio.

Further, in the liquid crystal display apparatus of the present invention, the insulating layer is made thicker at the portion under the source than that at the portion under the drain, whereby the parasitic capacitance of the signal wiring connected to the source is reduced. Thus, in a larger display apparatus with a larger number of picture elements, the liquid crystals can be driven normally, and high brightness, high gradation and high fineness of image display are achievable by use of such a liquid crystal display apparatus of the present invention.

DESCRIPTION OF THE PREFERRED EMBODIMENTS

The liquid crystal display apparatus of the present invention has the construction as described above. Reference examples are described firstly before describing the examples of the present invention. All of the constructions described in the reference examples are applicable in examples of the present invention. The liquid crystal display apparatus of the present invention includes modifications obtained by partially substituting or employing the constitution disclosed in the reference examples.

Reference Example 1

In this Reference Example, a transmission type panel is described in which an element substrate (or matrix substrate) is formed by providing switching elements (transistors) and other devices on a transparent insulating substrate.

Figure 7A:
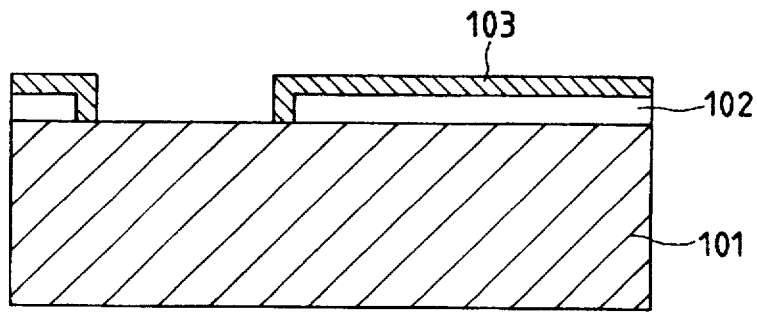
FIGS. 7A to 7C are schematic partial sectional views of the matrix substrate of the liquid crystal display apparatus of a reference example of the present invention.
Figure 7B:
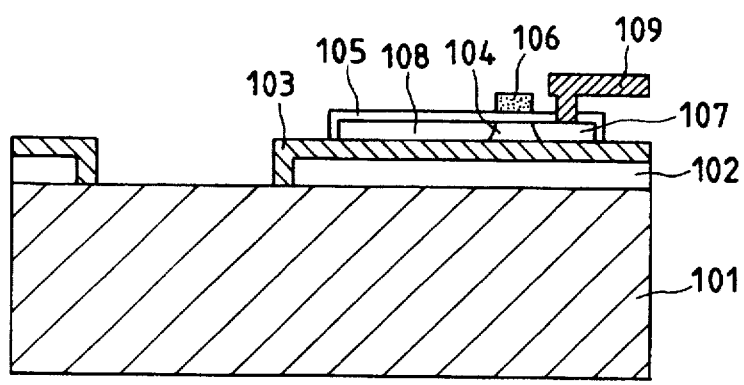
Figure 7C:
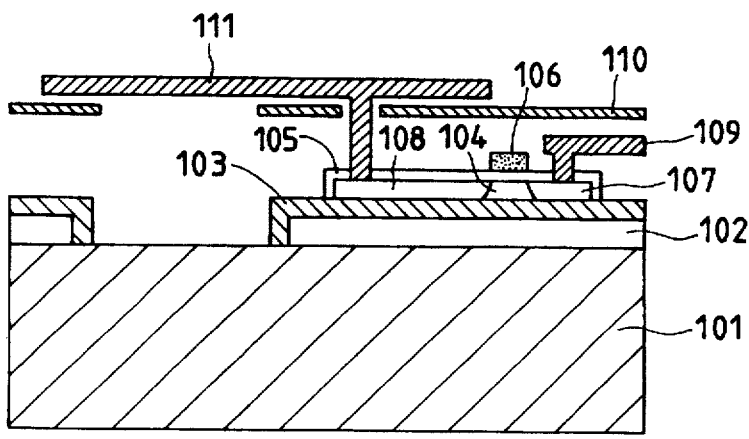

The production process of the element substrate is explained by reference to the schematic sectional views in FIGS. 7A to 7C. In FIGS. 7A to 7C and the description below, the insulating interlayer and the step of formation thereof are omitted.

Firstly, a conductive film 102 is deposited on a transparent insulating substrate 101, and patterning is conducted by etching. A part of the etched portion of the conductive film 102 serves later as the aperture of the display apparatus. Then an insulating layer 103 is formed on the conductive film 102. (FIG. 7A)

Polysilicon 104 is deposited thereon for formation of a transistor. Then, gate oxidation is conducted to form a gate-insulating film 105. Gate polysilicon 106 is formed further thereon. Source-drain regions 107, 108 are formed by ion implantation. A signal wiring 109 is connected to the source 107 through a contact hole. (FIG. 7B)

Subsequently, a light-intercepting conductive film 110 is formed, and then a transparent picture element electrode 111 is formed from a material such as ITO, in contact with the drain 108 via a through-hole. (FIG. 7C)

The resulting element substrate is placed in opposition to a transparent substrate having a counter-electrode, etc., formed thereon, and a liquid crystal is sealed therebetween to produce a light-transmissive panel.

In this reference example, the retention capacitance for retaining the potential of the picture element electrode 111 comprises the capacitance between the drain region 108 and the conductive film 102 and the capacitance between the transparent picture element electrode 111 and the conductive light-intercepting film 110. Accordingly, a large retention capacitance is obtained without decreasing the aperture ratio, and the produced liquid crystal display apparatus is improved in brightness, fineness, and gradation.

In this Reference Example, the conductive film 102 as the common electrode for forming the retention capacitance is formed throughout the entire face except the aperture portion. Therefore, the parasitic resistance is remarkably reduced, and the potential of the picture element electrode 111 is stabilized in comparison with the conventional transmissive panel. Further, the drop of the aperture ratio is avoided which will be caused by wiring of the common electrode.

The conductive light-intercepting film 110 in the above explanation may be omitted. When it is omitted, the gradation is improved by providing a black matrix on the side of the counter-electrode.

The conductive film 102 can be formed from ion-implanted polysilicon, monocrystalline silicon, ITO, or the like. When ITO is employed, the ITO film may be formed by a low-temperature polysilicon film formation process. The insulating film 103 can also be formed by patterning of the conductive film 102 and subsequent oxidation of the surface of the film.

In a thin film transistor, the leakage current can be reduced and the breakdown voltage can be raised by employing the source 107 and the drain 108 of an electric field relaxation structure like a mask offset structure or a DDD structure.

In the above description, a transmission type panel is explained. The capacitance formation shown above is effective for a reflective panel which is constructed by employing a reflective electrode as the picture element electrode 111. In such a construction, the substrate 101 need not be transparent, and may be a silicon substrate, a metal substrate, or the like. In the reflection type panel, the conductive light-intercepting film 110 for capacitance formation need not be light-intercepting provided that it is conductive. Naturally, the conductive film may be modified to be suitable for the reflection type panel such that the film may be placed above the picture element electrodes or on the opposing substrate, or the reflection of the film itself is reduced, and apertures are not necessary, thereby obtaining a larger capacitance.

Reference Example 2

In the above Reference Example 1, the regions to be made transparent (aperture regions) are formed by etching of the conductive film 102. In this Reference Example, the film is made transparent by selective oxidation.

Figure 8A:
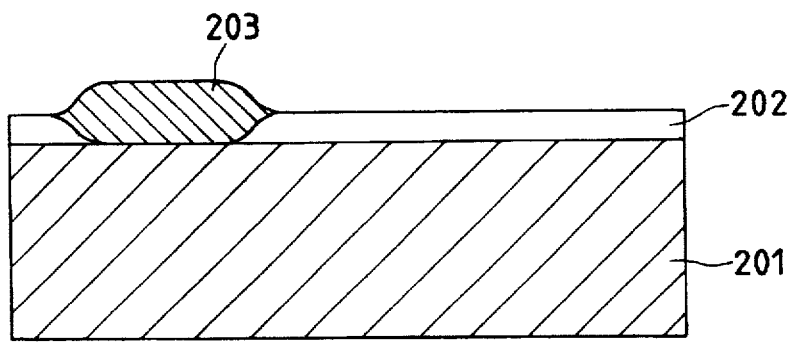
FIGS. 8A to 8C are schematic partial sectional views of the matrix substrate of the liquid crystal display apparatus of another reference example of the present invention.
Figure 8B:
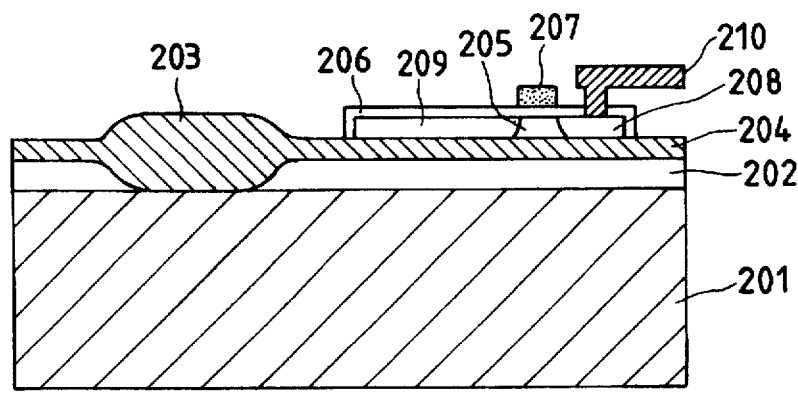
Figure 8C:
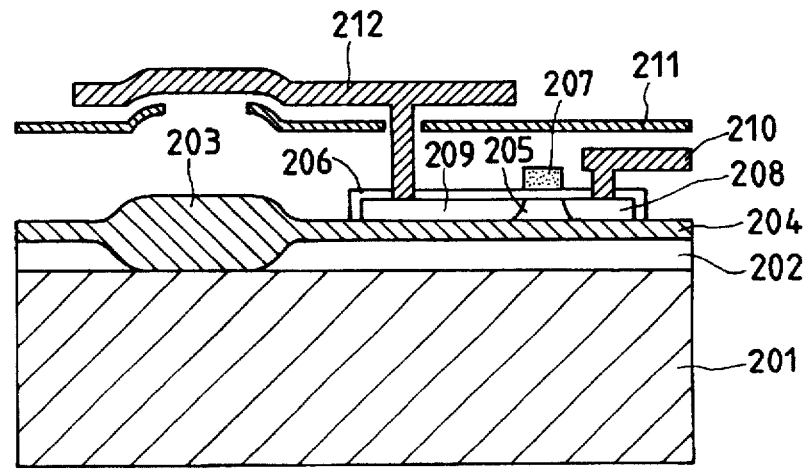

The process for producing the element substrate in this Reference Example is explained by reference to the schematic sectional views in FIGS. 8A to 8C. In FIGS. 8A to 8C and the description below, the insulating interlayer and the step of formation thereof are omitted.

Firstly, a conductive film 202 is formed on a transparent insulating substrate 201. The conductive film 202 is made conductive, for example, by impurity implantation into silicon. The crystallinity may be polycrystalline, amorphous, or monocrystalline. In this Reference Example, the transparent region 203 is formed by selective oxidation of a part of the conductive film 202. (FIG. 8A)

Then an insulating film 204 is formed by oxidation on the conductive film 202. Thereafter, in the same manner as in Reference Example 1, polysilicon 205 is deposited thereon for formation of a transistor. Then, gate oxidation is conducted to form a gate insulating film 206. Gate polysilicon 207 is formed further thereon. Source-drain regions 208, 209 of the transistor are formed by ion implantation. A signal wiring 210 is connected to the source 208 through a contact hole. (FIG. 8B)

Subsequently, a conductive light-intercepting film 211 is formed, and then a transparent picture element electrode 212 is formed so as to come into contact with the drain 209 through a through-hole. (FIG. 8C)

The resulting element substrate is placed in opposition to a transparent substrate having a counter-electrode formed thereon, and a liquid crystal is sealed therebetween to produce a light-transmissive panel.

Generally, in use of liquid crystal of TN or the like, an orientation film (not shown in the drawing) of polyimide or the like is formed on the picture image electrodes or on the insulating film on the picture element electrodes, and the surface of the film is rubbed to control the orientation of the liquid crystal. However, when the roughness of the surface is significant, rubbing is liable to be insufficient in some regions owing to the surface roughness, which may cause insufficient control of orientation of the liquid crystal to give rise to defects in orientation. Such an orientation defect causes a white spot, for example, in the display of black color at the point of the roughness, thereby impairing the panel contrast, disadvantageously.

In contrast thereto, in this Reference Example, the aperture portions bulge out since the aperture portions are formed by selective oxidation. Therefore, at least the peripheral portions of the apertures are uniformly rubbed to realize high controllability of the liquid crystal and high contrast of the liquid crystal panel.

The above description is made regarding a transmission type panel. In the construction of a reflection type panel, the same effects are obtained. The bulging of the aperture portions is also effective for improving the contrast of the panel in liquid crystal display apparatuses employing no rubbing treatment. For example, polymer scattering type liquid crystal does not require the rubbing treatment. With such a liquid crystal, when the aperture portions are lower than other portions, the potential of the portion other than the aperture affects greatly the electric field to cause application of an abnormal electric field to the liquid crystal to impair the contrast and gradation of the panel. In the case of this Reference Example, the bulging of the aperture portions prevents the influence of the potential in other regions to improve the contrast and the gradation.

According to this Reference Example, another effect can be obtained in addition to the effect of Reference Example 1, and a liquid crystal display apparatus of high contrast can be provided.

Reference Example 3

In this Reference Example, a peripheral driving circuit for driving a switching element comprising a thin film transistor is formed on a monocrystalline semiconductor substrate.

Figure 9:
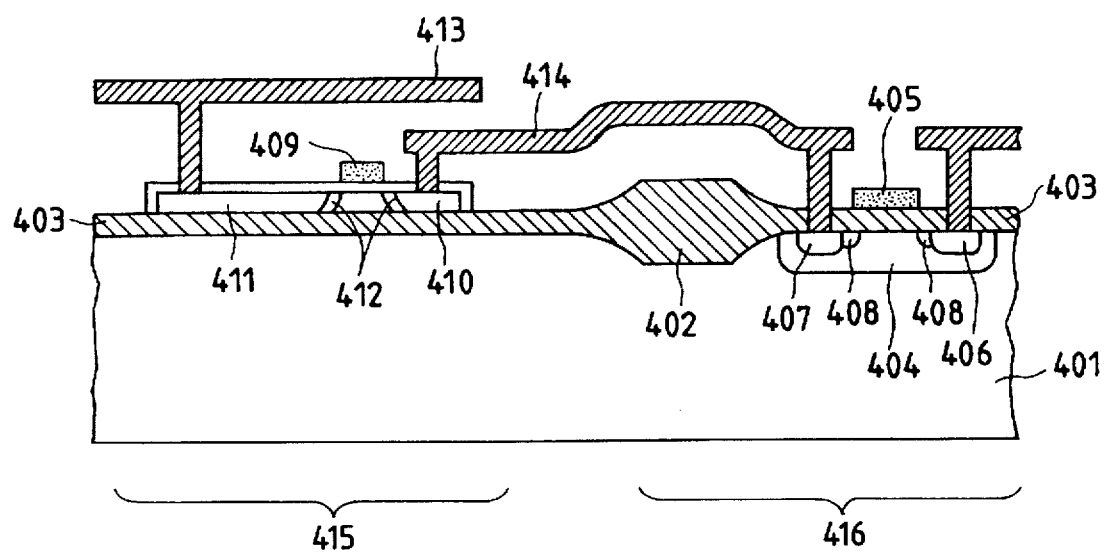
FIG. 9 is a schematic partial sectional view of the matrix substrate of the liquid crystal display apparatus of still another reference example of the present invention.

The element substrate of this Reference Example is explained by reference to the schematic sectional view of FIG. 9. In FIG. 9 and the description below, the insulating interlayer and the step of formation thereof are omitted.

In FIG. 9, the numeral 401 denotes a monocrystalline semiconductor substrate which is made, for example, from a silicon wafer. The numeral 415 denotes a display portion. The numeral 416 denotes a driving circuit portion. The numeral 402 denotes a LOCOS oxidation film for separation of elements of transistors in a driving circuit. The numeral 403 denotes a thin insulating film which may be formed by oxidation of the surface of the wafer 401. This insulating film 403 serves as a gate insulating film, and also serves as an insulating film for forming the retention capacitance of the display picture element portion. The numeral 404 denotes a well region of a transistor constituting the drive circuit. The well region 404 may be omitted when the substrate 401 serves as the well. The numeral 405 denotes a gate electrode for the drive circuit, and can be formed in the same step as a transistor gate electrode 409. The numerals 406 and 407 denote a source and a drain of the drive circuit. In this Reference Example, a low concentration layer 408 is provided for electric field relaxation in order to increase the breakdown voltage of the source 406 and the drain 407. The numerals 410 and 411 denote respectively a source and a drain of a picture element transistor. A low concentration layer 412 is provided for electric field relaxation in order to increase the breakdown voltage of the source 410 and the drain 411. The drain 411 and the substrate 401 form a capacitance with interposition of the thin insulating film 403 as the retention capacitance of the picture element electrode potential. The drain 411 is connected to a picture element electrode 413. The source 410 is connected to a signal line 414.

In this Reference Example, the parasitic capacitance can be reduced by forming the source 410 and the signal line 414 on the LOCOS oxidation film 402 by employing the construction shown in Example 1, as described later.

The driving circuit may be formed by a single type transistor, or may be of a CMOS structure. In this Reference Example, since the driving circuit is formed on a silicon wafer, the driving force is strong, and leakage current is weak in comparison with the one employing polysilicon or amorphous silicon, which enables production of a miniaturized fine panel with high productivity.

The resulting element substrate is placed in opposition to an opposing substrate having a counter electrode, etc. thereon, and a liquid crystal is sealed therebetween to produce a reflection type panel. In the reflection type of liquid crystal display apparatus of this Reference Example, the picture element electrode 413 is a reflective electrode. A transmission type panel can be constructed by employing a transparent electrode as the picture element electrode 413. For the transmission type panel, the display portion has to be transparent. This is described in detail in Reference Example 4.

In this Reference Example, the picture element electrode is in direct contact with the drain. The contact resistance can be reduced by connecting the picture electrode and the drain through aluminum or the like.

Reference Example 4

Figure 10:
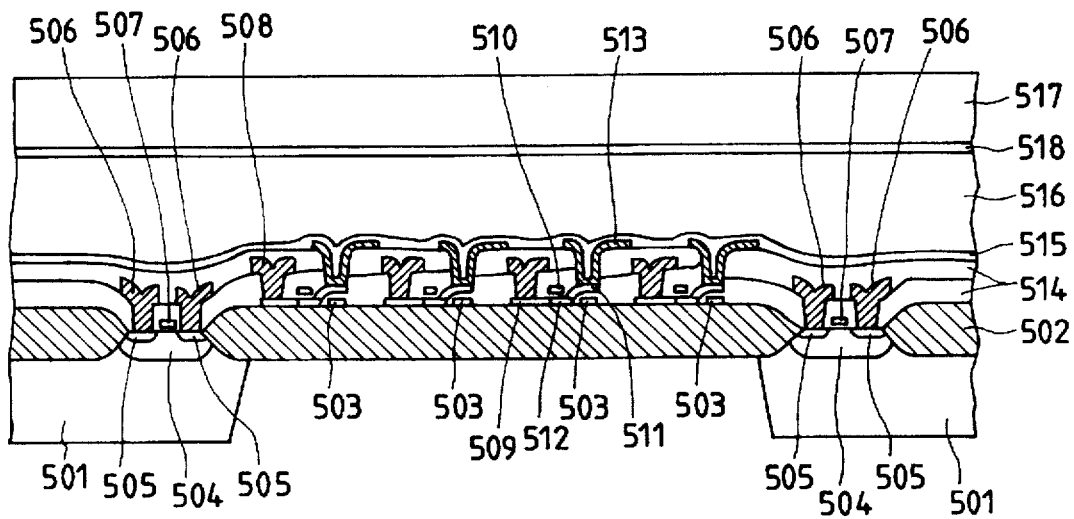
FIG. 10 is a schematic sectional view of a liquid crystal cell of the liquid crystal display apparatus of a reference example of the present invention.

A transmission type of liquid crystal display apparatus is explained which is constructed by forming a peripheral driving circuit for a switching element of a thin film transistor on a monocrystalline semiconductor substrate in this Reference Example. FIG. 10 is a partial sectional view of the panel of this Reference Example.

In FIG. 10, the numeral 501 denotes a monocrystalline semiconductor substrate; 502, an insulating layer typified by $SiO_2$; and 503, a conductive layer provided under a drain 511 of a picture element TFT with interposition of an insulating layer. This conductive layer 503 is made, for example, of a polysilicon layer, provided in a form of a network on the picture element portion, and connected to a power source on the periphery of the substrate. The numeral 504 denotes a well of MOSFET formed on the substrate 501; 505, a source/drain diffusion layer of the MOSFET; 506, a metal wiring connected to the source/drain; 507, a gate electrode of the MOSFET; 508, a signal wiring connected to the source region of the picture element FET; 509, a source region of the picture element TFT; 510, a gate of the picture element FET; 511, a drain of the picture element FET; 512, a channel of the picture element FET; 513, a transparent picture element electrode; 514, an insulating interlayer; 515, an orientation film; 516, a liquid crystal layer; 517, an opposing substrate; and 518, a layer of a transparent counter electrode, a color filter, a black matrix, or the like provided on the opposing substrate 517.

To produce a transmission type panel, the picture element-displaying portions of the substrate 501 are etched off for transparency in this Reference Example. For uniform etching, an etching solution such as TMAH is employed which etches more rapidly silicon than the oxide film. An insulating film 502 such as a LOCOS film can be used as the etching stopper in the etching. A silicon nitride film may be used as the etching stopper by depositing a silicon nitride film onto the insulating film 502 before construction of the picture element transistor.

As shown in FIG. 10, the peripheral circuit for driving the liquid crystal in this Reference Example is formed on a bulk monocrystalline semiconductor substrate, having the advantages of high speed and high reliability. The picture element display portion is formed from thin film transistor resistant to light leakage, and is less irregular in orientation owing to the small thickness of about 300 and flatness of the picture image region, whereby high contrast of the image display is accomplished.

Further, a conductive layer 503 made of polysilicon is provided for forming the retention capacitance under the drain region 511 connected to the transparent picture element electrode 513 of the image element displaying portion, which makes lower the height of the through-hole for connecting the picture element electrode 513 and the drain region 511. Thereby, the connection is facilitated advantageously in production.

Figure 11:
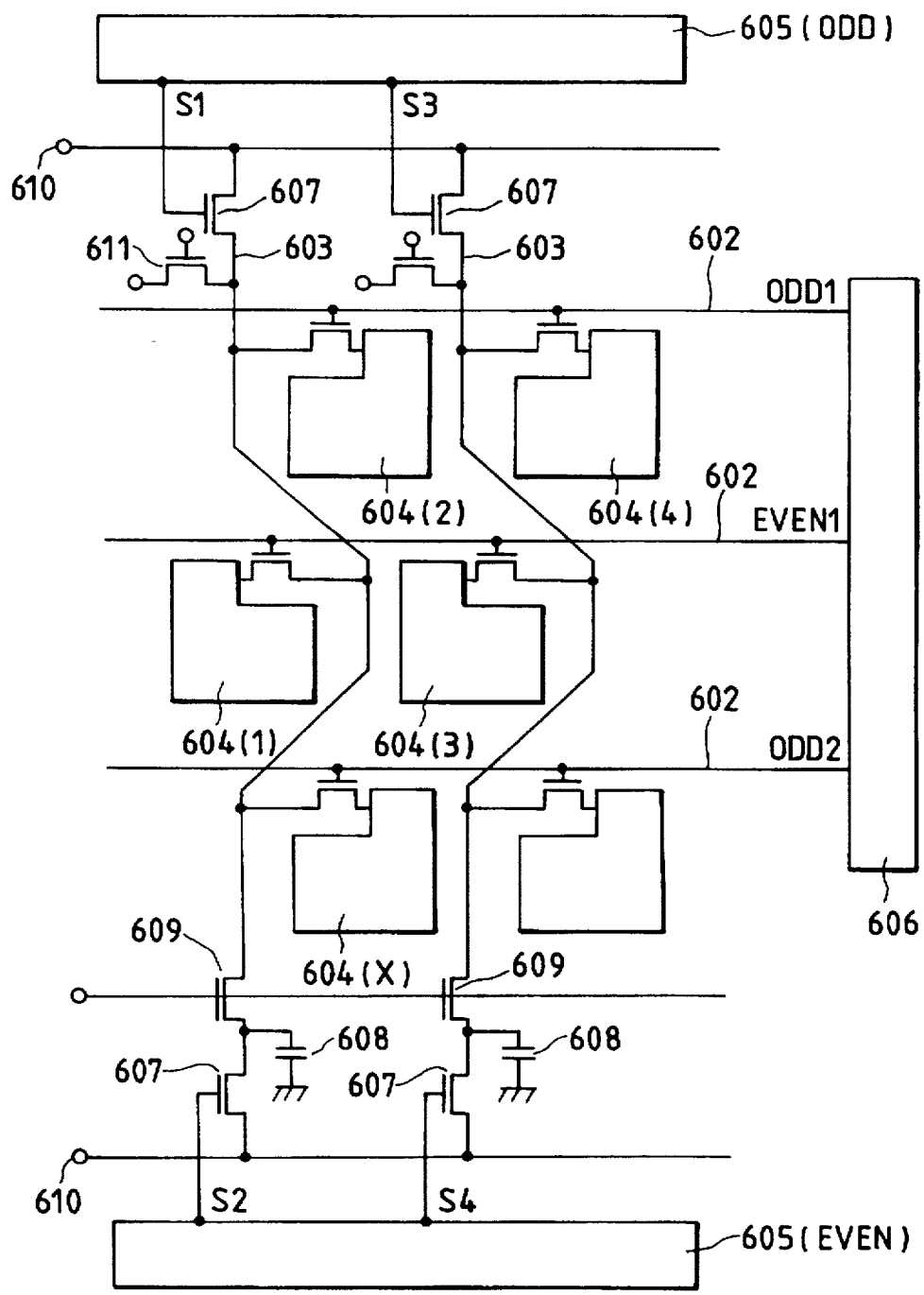
FIG. 11 is a partial equivalent circuit of a liquid crystal display apparatus of the present invention.

FIG. 11 is an equivalent circuit of an active matrix type of liquid crystal display apparatus of this Reference Example. In FIG. 11, the numeral 601 denotes a picture element TFT; 602, a scanning line; 603, a signal line; 604, a picture element electrode; 605 a horizontal shift resistor; 606, a vertical shift resistor; 607, an image signal transmitting switch driven by the horizontal shift resister; 608, a capacitance for temporarily retaining the image signal; and 609, a second image signal transmitting switch for collectively transmitting the temporarily retained image signal from the retention capacitance to the picture element electrode. The image signals are successively transmitted from the image signal input terminal 610 at time intervals. The numeral 611 is a reset switch for the signal line 603.

Figure 12:
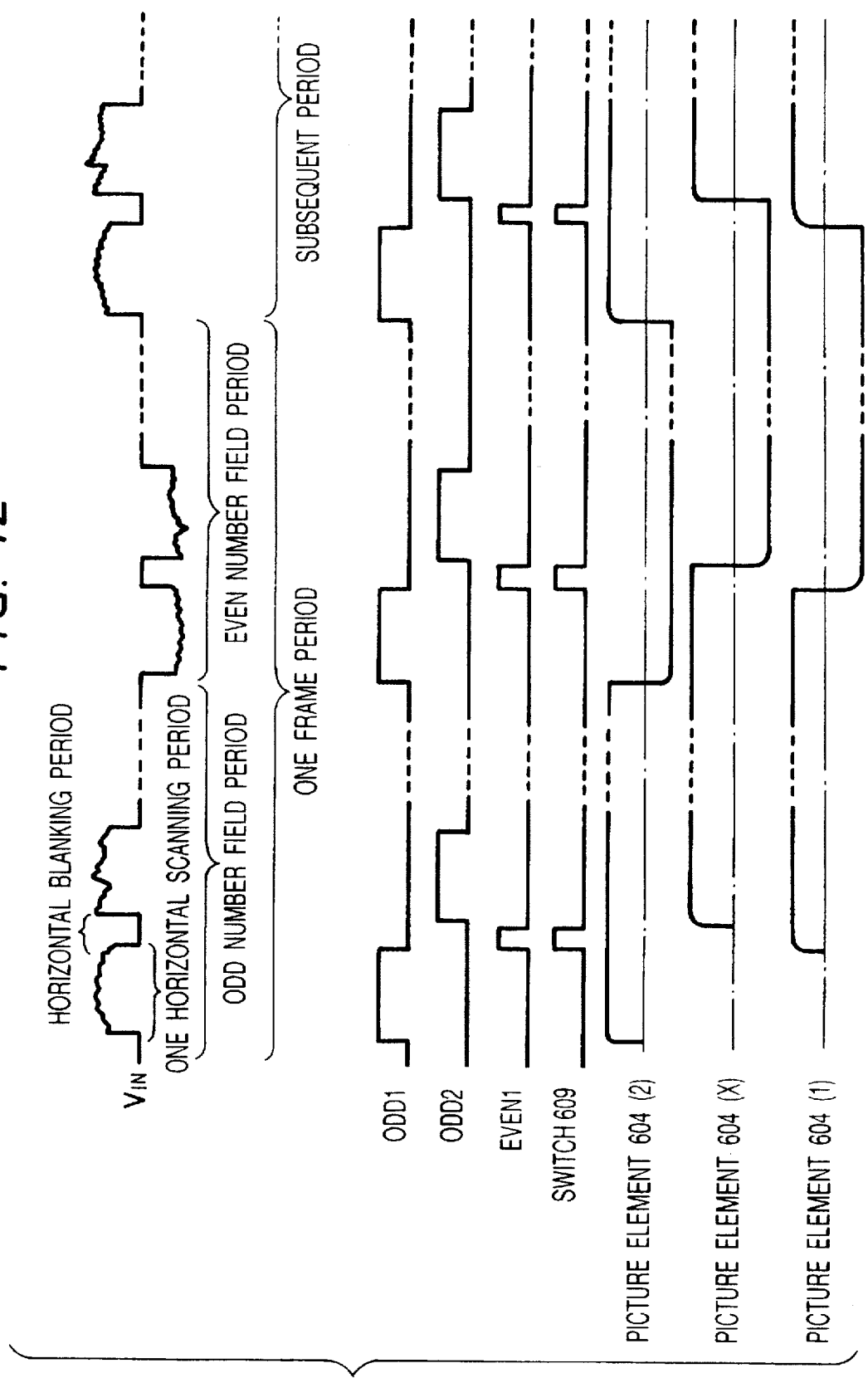
FIG. 12 is an example of the drive pulse timing chart of the liquid crystal display apparatus.
Figure 13:
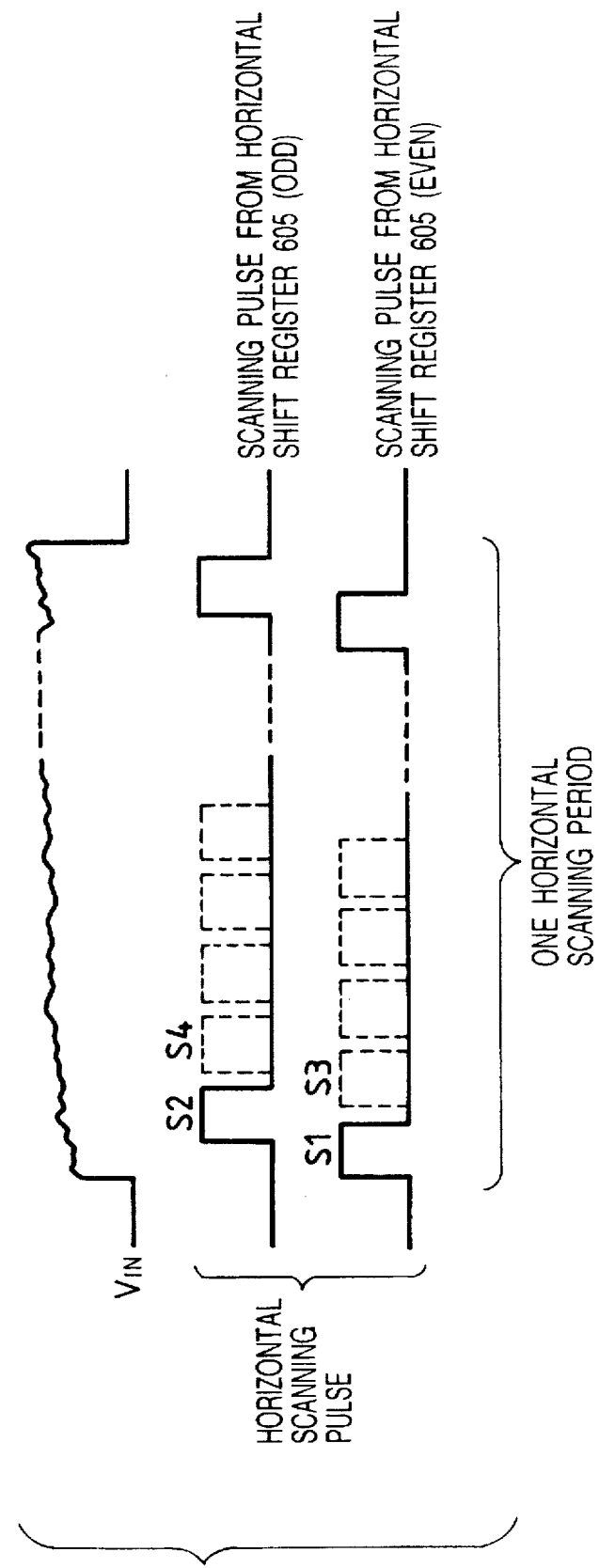
FIG. 13 is another example of the drive pulse timing chart of the liquid crystal display apparatus.
Figure 14:
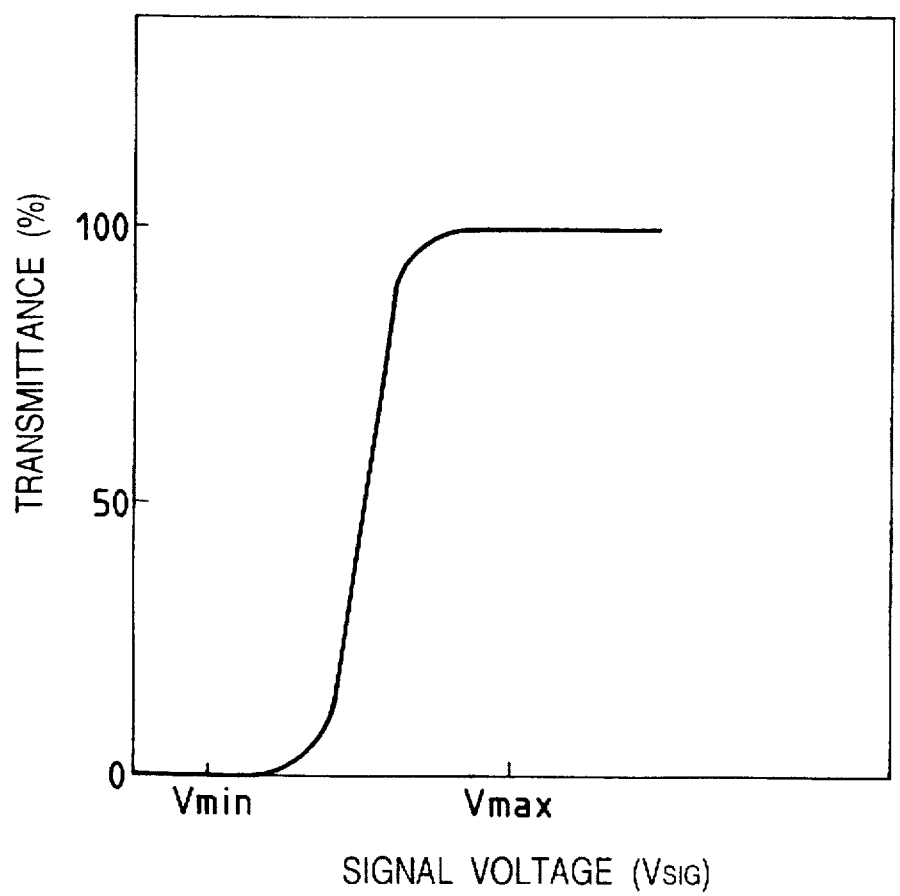
FIG. 14 shows relation between the signal voltage of the liquid crystal display apparatus and the transmittance.

FIG. 12 and FIG. 13 are respectively a driving pulse timing chart of an active matrix type of liquid crystal display apparatus. The image signals are transmitted in such a manner that the signals corresponding to the odd number lines, and signals corresponding to even number lines are transmitted alternately for each field period. Therefore, in operation of the liquid crystal display apparatus, a scanning signal is firstly transmitted from the vertical shift resister 606 to an odd-number scanning line (ODD1) in an odd-number field to switch on the picture element TFT 601 of the odd-number line. During that period, the image signal to be recorded in the liquid crystal is recorded in the picture element electrode 604(2), 604(4) of respective picture elements through the transmitting switch 607 successively driven by the horizontal shift resister 605 (ODD) generating horizontal scanning pulses synchronously with the image signal. Simultaneously, the image signals are transmitted to the capacitance 608 through the transmitting switch 607 successively driven by a horizontal sift resister 605 (EVEN) generating horizontal scanning pulses synchronously with the image signal. Then in the horizontal blanking period, the reset switch 611 is switched on to reset once the signal line 603, and a scanning signal is transmitted to an even number scanning line (EVEN1) to switch on the even line number of picture element TFT 601, the second image signal transmitting switch 609 is switched on to record image signals in the respective picture element electrodes 604(1), 604(3). In this manner, the image signals are recorded successively in picture element electrodes. The liquid crystal molecules changes its states in correspondence with the transmitted signal voltage, and changes light transmissivity depending on the direction of a polarizing plate separately provided to act as a cross-polarizer. FIG. 14 shows the change of the transmittance of the liquid crystal cell.

Figure 15:
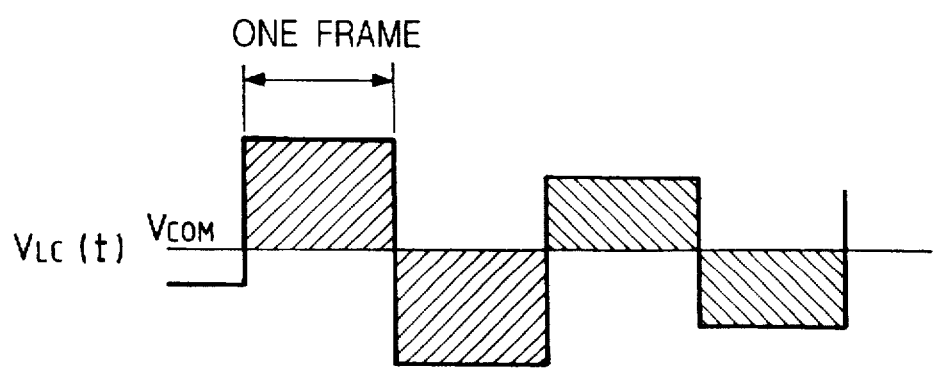
FIG. 15 is a diagram for explaining the operation of the liquid crystal display apparatus.

The definition of the signal voltage $V_{SIG}$ of the abscissa in FIG. 14 depends on the kind of liquid crystal employed. For twisted nematic liquid crystal (TN), the value is defined as the effective voltage ($V_{rms}$). This value is explained qualitatively by FIG. 15. The polarity of the signal voltage is changed alternately for each frame to prevent permanent immobilization of the liquid crystal caused by DC voltage component applied to the liquid crystal. The liquid crystal itself behaves in accordance with the AC voltage component as indicated by the shadow in FIG. 15. The effective voltage $V_{rms}$ is defined by the equation below:

$$V_{rms} = \sqrt{\frac{1}{tF} \int_0^{tF} (V_{LC}(t) - V_{COM})^2 dt}$$

where tF is the time for two frames, $V_{LC}(t)$ is the signal voltage transmitted to the liquid crystal, and $V_{COM}$ is the voltage applied to the counter-electrode.

In FIG. 14, $V_{rms}$ is equivalent to $V_{SIG}$, and the liquid crystal cell changes its light transmittance in accordance with $V_{rms}$ to display an intended image.

In one method for improving the image resolution in the horizontal direction, the picture elements are displaced, for example, by 0.5 picture element size. Thereby, the horizontal intervals between the picture elements adjacent to each other in an odd number line are filled by picture elements of even number line, and the horizontal resolution is improved seemingly. In this method, the timings of the horizontal scanning pulses have to be shifted between the odd-number lines and the even-number lines as shown in the timing chart in FIG. 13.

The panel of this Reference Example can also be driven without the retention capacitance 608. In this method, only one horizontal shift resistor is required. An example is explained in which 605 (ODD) is employed without employing 605 (EVEN), 607, 608, and 609.

The data are inputted from an external memory to the image signal input terminal 610. By driving the horizontal shift register 605 (ODD) at a speed twice that of example in FIG. 11, one line of writing is conducted in half the horizontal scanning period, and the same number of the picture elements can be driven as in the example of FIG. 11 without collective writing in the blanking period. In this method, the read-out from the external memory is conducted at a double speed corresponding to the horizontal scanning speed.

This example is readily made practicable owing to the effects of the present invention of the small capacitance of the signal lines, and the low time constant of writing. Further, the shift registers and the switches are decreased in number, enabling miniaturization of the panel; miniaturization, weight reduction, and cost reduction of the product; and high yield of production to lower the production cost advantageously.

Generally as mentioned above in a liquid crystal display apparatus, the signal voltage is applied by alternately changing the voltage polarity to prevent permanent immobilization of the liquid crystal which will be caused by applied of DC voltage component. At the time of the polarity change, the light transmittance will change slightly. At a change cycle of 1/30 second, this change is perceived by the human eye as variation of brightness or flickering. However, the flickering can be prevented by the above-mentioned simultaneous two-line driving method in which the same image signals are written in on the odd-number lines and the even-number lines and decreasing the polarity reversal cycle time by one-half to 1/60 second.

EXAMPLE 1

The apparatus is characterized by the thickness of the insulating layer which has a larger thickness at the portion under the source than at the portion under the drain. In this Example, this characteristic structure is are mainly explained. However, the present invention includes modifications obtained by partially substituting, employing, or supplementing the constitution disclosed in Reference Examples, such as process for producing the element substrate, the driving circuit, and the materials for constituting the liquid crystal display apparatus.

In this Example, the element substrate is a silicon substrate containing an impurity and having electroconductivity.

Figure 1:
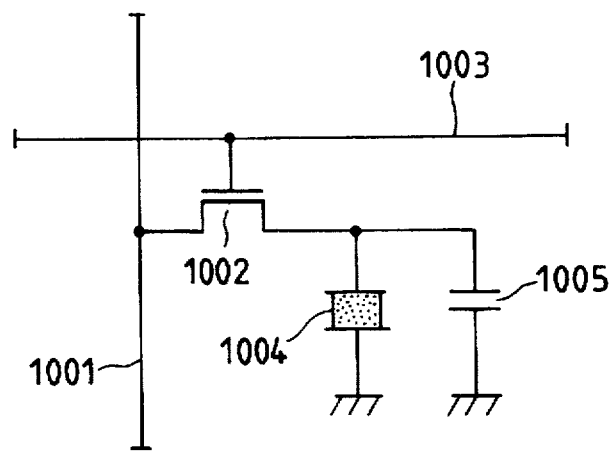
FIG. 1 illustrates an equivalent circuit of a picture element cell of a conventional active matrix type of liquid crystal display apparatus.
Figure 2A:
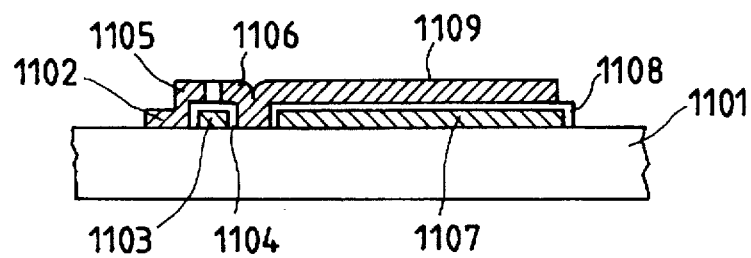
FIGS. 2A and 2B illustrate a sectional view of a structure and a plan view of a picture cell of a conventional liquid crystal display apparatus.
Figure 2B:
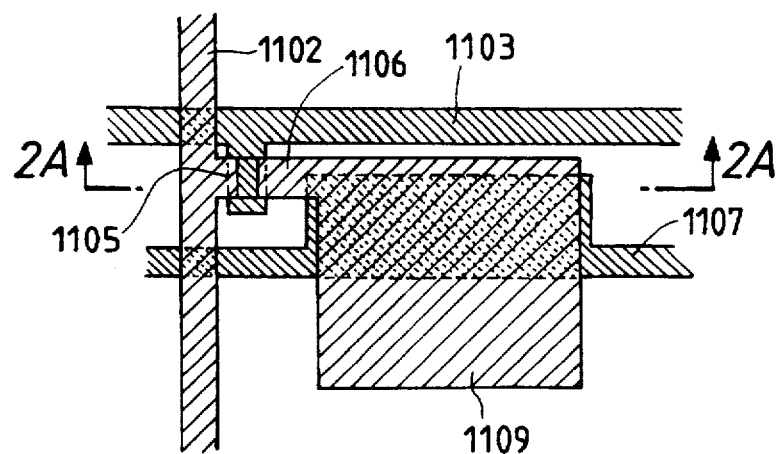
Figure 3:
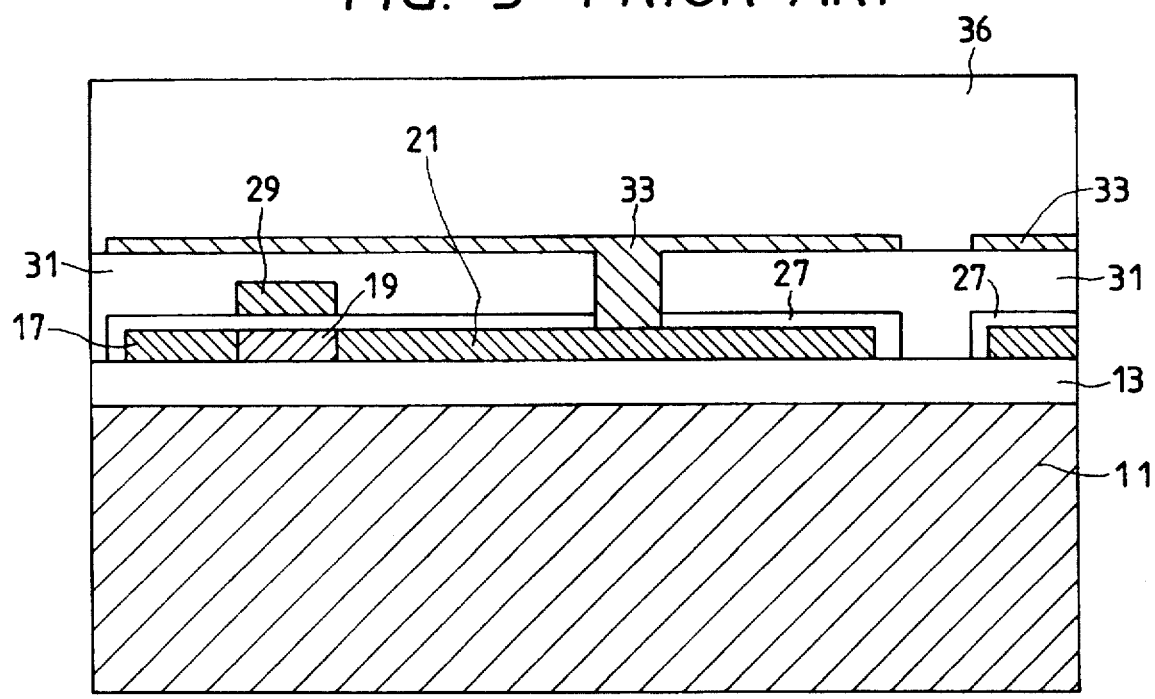
FIG. 3 is a schematic drawing of an example of conventional liquid crystal display apparatuses.
Figure 4:
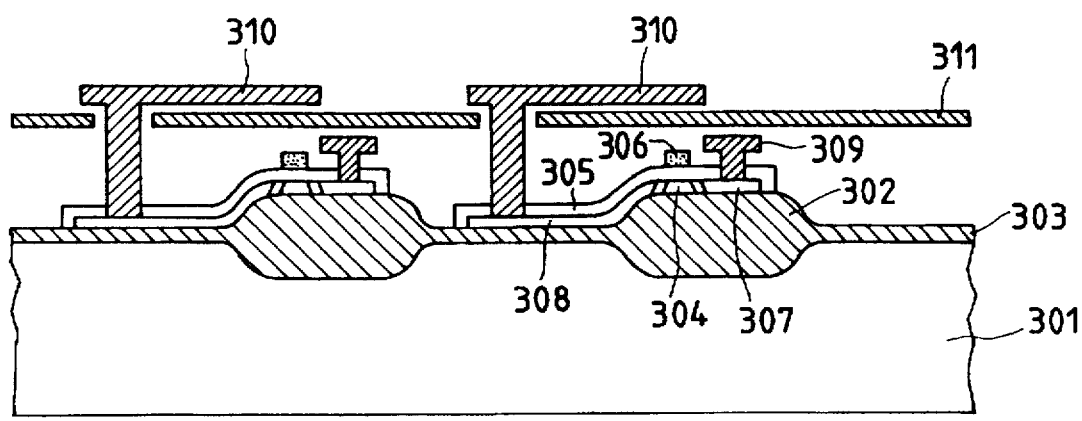
FIG. 4 is a schematic partial sectional view of an example of the matrix substrate of the liquid crystal display apparatus of the present invention.

The element substrate is explained by reference to a schematic sectional view of FIG. 4. In FIG. 4 and the description below, the insulating interlayer and the step of formation thereof are omitted.

In FIG. 4, the numeral 301 denotes an impurity-containing conductive silicon substrate; 302, $SiO_2$ formed by selective oxidation (hereinafter referred to as "LOCOS oxidation film"); 303, an oxidation film thinner than the LOCOS oxidation film 302; 304, a polysilicon or an amorphous silicon to be converted to a transistor; 306, a gate electrode formed on the surface thereof with interposition of a gate oxidation film 305; 307, a source; and 308, a drain. The source 307 and the drain 308 are formed by diffusion of an impurity. The source region and the drain region may be formed by implantation of two kinds of ions having respectively a diffusion coefficient different from each other, or application of offset through a mask to have an LDD structure in which the impurity concentrations change stepwise to improve the breakdown voltage. The source 307 is connected to a signal wiring 309 through a contact hole. The drain 308 is connected to a picture element 310 via a through-hole. A conductive layer 311 and the picture element 310 form capacitance therebetween. Interception of light to the transistor portion by the conductive layer 311 makes practicable the decrease of light leakage of the transistor.

The element substrate of the above construction is placed in opposition to an opposing substrate having a counter electrode and the like formed thereon, and a liquid crystal is sealed between them to provide a reflection type panel. Incidentally, the picture element electrode 310 may be formed from aluminum or a like metal in the reflection type of liquid crystal display apparatus in this Example.

In this Example also, a liquid crystal display apparatus can be constructed without the conductive layer 311. Naturally, with such an apparatus, the contrast and gradation of the display apparatus can be improved by interception of light by a thin film transistor to decrease light leakage current.

The retention capacitance for retaining the potential of the picture element electrode 310 is also formed between the drain 308 and the substrate 301 with interposition of thin oxidation film 303. The potential of the substrate is kept constant at least a portion of the substrate. When the parasitic capacitance of the substrate is large to cause little variation of the potential, a potential need not be applied intentionally. When the conductive layer 311 is provided, the retention capacitance comprises the parallel capacitances between the drain 308 and the substrate 301, and the picture element electrode 310 and the conductive layer 311.

One characteristic of this Example is that the insulating film 303 between the substrate 301 and the drain 308 is thin, and the insulating film 302 between the 301 and the source 307 is thick to provide a display apparatus having a large retention capacitance and a small parasitic capacitance of the signal line. The thin insulating film 303 constructed by thermal oxidation of the silicone substrate suppresses insulation breakdown and leakage even at application of a high electric field intensity, enabling decrease of the thickness thereof to increase further the retention capacities.

In the present invention, the thin insulating film 303 has a thickness ranging from 50 to 2000 Å, preferably from 500 to 1500 Å, more preferably 700 to 1000 Å, and the thick insulating film 302 has a thickness ranging from 2000 to 15000 Å, preferably from 2000 to 10000 Å, more preferably 4000 to 8000 Å.

A large parasitic capacitance of the signal line results in a large time constant. This causes the problem that driving of a display apparatus becomes, infeasible when the number of the picture elements is increased or the display apparatus is made larger in size. When a driving system is employed in which video signals are once memorized in the capacitance of a chip and then written in picture elements, the parasitic capacitance of the signal line becomes larger, and the memory capacitance has to be increased, resulting in an increase of the chip size, and a decrease of the number of the chips producible from one piece of wafer. In the present invention, however, the source 307 and the signal line 309 are placed on the LOCOS oxidation film 302, thereby the parasitic capacitance of the signal line is made smaller.

In this Example, a light-intercepting layer 311 is provided. However, the light-intercepting layer 311 is not necessary when the capacitance formed between the drain 308 and the substrate 301 is sufficiently large. In the construction without the layer, the light can be intercepted by a black matrix on the side of the opposing substrate having a color filter or the like. Further, a high-brightness reflection type panel without a polarizer plate can be produced by arranging the picture element electrodes 310 in an oblique direction to the substrate 301 and using a polymer dispersion type liquid crystal layer between the picture element electrode and the opposing substrate.

EXAMPLE 2

Figure 5:
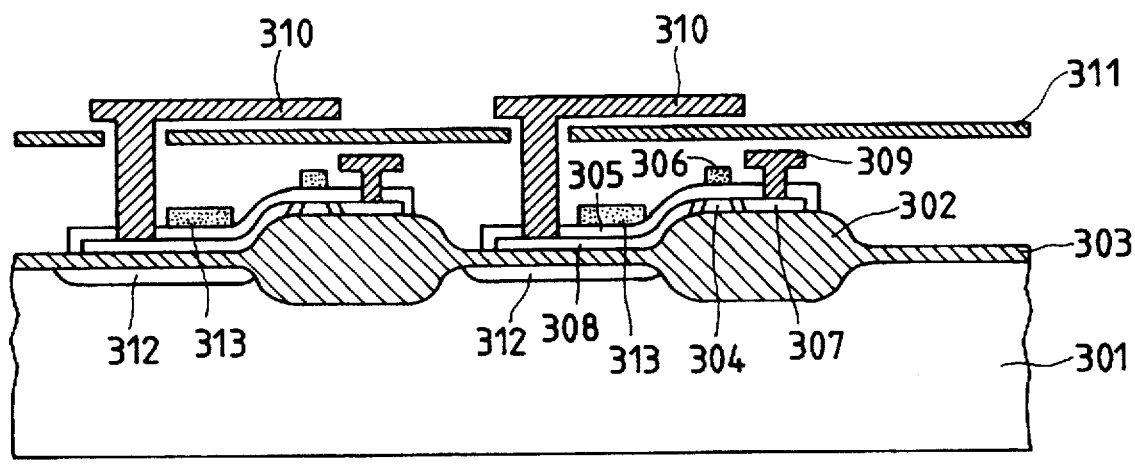
FIG. 5 is a schematic partial sectional view of another example of the matrix substrate of the liquid crystal display apparatus of the present invention.

This Example is described by reference to FIG. 5. An impurity diffusion layer 312 is provided to stabilize the retention capacitance between the drain 308 and the substrate 301. The impurity diffusion layer 312 is of the same conduction type as that of the substrate 301, and inhibits expansion of the depletion layer under the drain 308 to avoid variation of the capacitance value. A reversed capacitance can be formed by setting the potential of the substrate 301 to form reversion region under the drain 308. With the reversed capacitance, the capacitance is further stabilized by providing the impurity diffusion region of the conduction type opposite to the substrate in adjacent to the reversion region in order to supply the charges of the reversion region.

In the process for formation of the gate electrode 306, the wiring 313 can be formed to form a capacitance between the drain 308 and the wiring. The wiring 313 is provided in one direction or in a checker pattern on the display portion to apply a potential at the periphery of the display portion. In a case where a high concentration layer of the source or the drain is applied in a mask, the high concentration layer is formed by ion-implantation prior to formation of the wiring 313 and low concentration layer is formed after formation of the wiring 313 and the gate electrode 306 with high conformity with the process of a gate self aligning transistor. This capacitance is connected to the capacitance between the drain 308 and the substrate 301 or the picture element 310 and the light-intercepting film 311 in parallel to increase further the retention capacitance.

EXAMPLE 3

In a thin film transistor, a larger thickness of source-drain regions and smaller thickness of a channel region are effective for decreasing leakage current. Regarding the driving force of a transistor, parasitic resistances between the channel and the source, and the channel and the drain may cause problems. The parasitic resistance can be lowered by increasing the film thickness. Additionally, larger thickness of the source and drain portions is advantageous in that the contact resistance is lowered and the etching of the contact is facilitated.

In this Example, a liquid crystal display apparatus is shown which is produced in consideration of the above matters.

Figure 6:
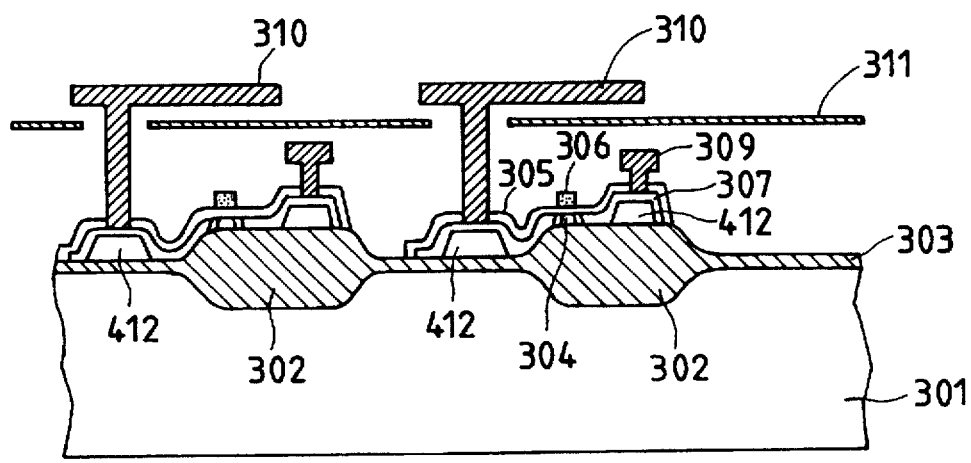
FIG. 6 is a schematic partial sectional view of still another example of the matrix substrate of the liquid crystal display apparatus of the present invention.

FIG. 6 is a schematic partial sectional view of an example of an active matrix substrate of the liquid crystal display apparatus. In FIG. 6, the same number as in FIG. 5 denotes the same thing, and explanation thereof is omitted. In the active matrix substrate in FIG. 6, a semiconductor region 412 is provided. Thereby, the semiconductor layer constituting the source and drain is formed thicker than the semiconductor layer 304 constituting the channel region. Such a construction as shown in FIG. 6 can be formed by patterning the semiconductor region 412 and then depositing the semiconductor layer 307. The region 412 may be formed in the same conduction type as the source and drain by ion implantation before forming the semiconductor layer 307. Otherwise, after deposition of the semiconductor layer 307, or after patterning of the gate 306, the impurity may be implanted at the same time as the ion implantation and diffusion in the source and the drain. With such a structure, a transistor can be formed in which the leakage current is less and the driving force is stronger.

What is claimed is:

1. A liquid crystal display apparatus comprised of elements each comprising a transistor at a region corresponding to a crossing region of a data signal wiring and a scanning signal wiring; a matrix substrate having data signal wiring connected to a source of the transistor, the scanning signal wiring connected to a gate of the transistor, and a picture element electrode connected to a drain of the transistor; an opposing substrate having a counter-electrode opposing to the picture element electrode; and a liquid crystal layer interposed between the matrix substrate and the opposing electrode, wherein a semiconductor layer for forming the matrix substrate or an electroconductive layer is placed under the transistor with interposition of an insulating layer, and the insulating layer has a larger thickness between the source and the semiconductor layer or the electroconductive layer than that between the drain and the semiconductor layer or the electroconductive layer.

2. The liquid crystal display apparatus according to claim 1, wherein a means for applying a prescribed potential to the electro-conductive layer is provided.

3. The liquid crystal display apparatus according to claim 1 or 2, wherein said matrix substrate comprises a moncrystalline semiconductor substrate having a transistor thereon, and wherein an insulating layer is interposed between said monocrystalline semiconductor substrate and said transistor, and wherein at least a portion of a peripheral circuit for driving said transistor is formed on said monocrystalline substrate.

4. The liquid crystal display apparatus according to claim 1, wherein the insulating layer has a thickness ranging from 2000 to 15000 Å between the source and the semiconductor layer or the electro-conductive layer.

5. The liquid crystal display apparatus according to claim 4, wherein the insulating layer has thickness ranging from 2000 to 10000 Å.

6. The liquid crystal display apparatus according to claim 5, wherein the insulating layer has a thickness ranging from 4000 to 8000 Å.

7. The liquid crystal display apparatus according to claim 1, wherein the insulating layer has a thickness ranging from 50 to 2000 Å between the drain and the semiconductor layer or the electro-conductive layer.

8. The liquid crystal display apparatus according to claim 7, wherein the insulating layer has a thickness ranging from 500 to 1500 Å.

9. The liquid crystal display apparatus according to claim 8, wherein the insulating layer has a thickness ranging from 700 to 1000 Å.

10. The liquid crystal display apparatus according to claim 1, wherein the semiconductor layer comprised of the source or the drain has a larger thickness than the semiconductor layer constituting a channel region of the transistor.

* * * * *

UNITED STATES PATENT AND TRADEMARK OFFICE
CERTIFICATE OF CORRECTION

PATENT NO. : 5,726,720

DATED : March 10, 1998

INVENTOR(S) : TAKANORI WATANABE ET AL.     Page 1 of 3

It is certified that error appears in the above-identified patent and that said Letters Patent is hereby corrected as shown below:

COLUMN 1

Line 23, "retain" should read --to retain--;
Line 30, "FIGS." should read --In FIGS.--;
Line 59, "causing" should read --,causing--; and
Line 64, "Gate" should read --gate--.

COLUMN 2

Line 22, "the," should read --the--; and
Line 41, "of-the" should read --of the--.

COLUMN 3

Line 54, "relation" should read --the relation--.

COLUMN 5

Line 20, "formed-by" should read --formed by--.

COLUMN 8

Line 17, "resistor;" should read --register;--;
Line 18, "resistor;" should read --register;--;
Line 19, "resister;" should read --register;--;
Line 41, "resister" should read --register--;
Line 45, "sift resister" should read --shift register--;
Line 56, "changes its" should read --change their--; and
Line 57, "changes" should read --change--.

UNITED STATES PATENT AND TRADEMARK OFFICE
CERTIFICATE OF CORRECTION

PATENT NO. : 5,726,720

DATED : March 10, 1998

INVENTOR(S) : TAKANORI WATANABE ET AL.   Page 2 of 3

It is certified that error appears in the above-identified patent and that said Letters Patent is hereby corrected as shown below:

COLUMN 9

Line 28, "resistor" should read --register--;
Line 33, "example" should read --the example--;
Line 52, "applied" should read --application--;
Line 56, "brightness" should read --brightness,--; and
Line 67, "are" should be deleted.

COLUMN 10

Line 4, "process" should read --processes--;
Line 54, "at least" should read --in at least--; and
Line 63, "the 301" should read --the substrate 301--.

COLUMN 11

Line 11, "becomes." should read --becomes--; and
Line 47, "in" should be deleted.

COLUMN 12

Line 52, "electro-conductive" should read --electroconductive--;
Line 54, "moncrys-" should read --monocrys- --;
Line 64, "electro-conductive" should read --electroconductive--; and
Line 66, "has" should read --has a--.

UNITED STATES PATENT AND TRADEMARK OFFICE
CERTIFICATE OF CORRECTION

PATENT NO. : 5,726,720

DATED : March 10, 1998

INVENTOR(S) : TAKANORI WATANABE ET AL.

It is certified that error appears in the above-identified patent and that said Letters Patent is hereby corrected as shown below:

COLUMN 13

Line 7, "electro-conductive" should read --electroconductive--.

Signed and Sealed this

Fifteenth Day of December, 1998

Attest:

BRUCE LEHMAN

Attesting Officer

Commissioner of Patents and Trademarks